United States Patent
Chang et al.

(10) Patent No.: US 7,541,234 B2
(45) Date of Patent: Jun. 2, 2009

(54) METHODS OF FABRICATING INTEGRATED CIRCUIT TRANSISTORS BY SIMULTANEOUSLY REMOVING A PHOTORESIST LAYER AND A CARBON-CONTAINING LAYER ON DIFFERENT ACTIVE AREAS

(75) Inventors: Chong Kwang Chang, Fishkill, NY (US); Haoren Zhuang, Hopewell Junction, NY (US); Matthias Lipinski, Poughkeepsie, NY (US); Shailendra Mishra, Beacon, NY (US); O Sung Kwon, Wappingers Falls, NY (US); Tjin Tjin Tjoa, Singapore (SG); Young Gun Ko, Fishkill, NY (US)

(73) Assignees: Samsung Electronics Co., Ltd. (KR); Chartered Semiconductor Manufacturing Ltd., Singapore (SG); Infineon Technologies AG (DE)

( * ) Notice: Subject to any disclaimer, the term of this patent is extended or adjusted under 35 U.S.C. 154(b) by 525 days.

(21) Appl. No.: 11/266,024

(22) Filed: Nov. 3, 2005

(65) Prior Publication Data

US 2007/0099126 A1    May 3, 2007

(51) Int. Cl.
*H01L 21/8238* (2006.01)

(52) U.S. Cl. .................. 438/199; 438/780; 438/793; 438/794; 438/149; 257/E21.041; 257/E21.049; 257/E21.005

(58) Field of Classification Search ................. 438/780, 438/793, 794, 149, 82, 99; 257/E21.041, 257/E21.049, E21.005, E51.038, E23.117, 257/E21.128, E21.459
See application file for complete search history.

(56) References Cited

U.S. PATENT DOCUMENTS

| 4,382,827 | A |   | 5/1983  | Romano-Moran et al. |
|-----------|---|---|---------|---------------------|
| 5,024,959 | A |   | 6/1991  | Pfiester            |
| 5,439,834 | A |   | 8/1995  | Chen                |
| 5,460,998 | A |   | 10/1995 | Liu                 |
| 5,620,919 | A | * | 4/1997  | Godinho et al. ............. 438/230 |
| 5,766,991 | A |   | 6/1998  | Chen                |
| 5,936,300 | A | * | 8/1999  | Sasada et al. ............... 257/632 |
| 6,359,276 | B1| * | 3/2002  | Tu .......................... 250/338.1 |

(Continued)

FOREIGN PATENT DOCUMENTS

JP    10-256390 A    9/1998

(Continued)

OTHER PUBLICATIONS

Notice of Allowance, KR 10-2006-0099917, Nov. 29, 2007.

(Continued)

*Primary Examiner*—N Drew Richards
*Assistant Examiner*—Ankush k Singal
(74) *Attorney, Agent, or Firm*—Myers Bigel Sibley & Sajovec, P.A.

(57) ABSTRACT

Integrated circuit transistors may be fabricated by simultaneously removing a photoresist layer on a first active area of an integrated circuit substrate and a carbon-containing layer on a second active area of the integrated circuit substrate, to expose a nitride stress-generating layer on the second active area. A single mask may be used to define the second active area for removal of the photoresist layer on the first active area and for implanting source/drain regions into the second active area.

16 Claims, 8 Drawing Sheets

U.S. PATENT DOCUMENTS

| | | | |
|---|---|---|---|
| 6,475,888 B1* | 11/2002 | Sohn | 438/535 |
| 6,573,172 B1* | 6/2003 | En et al. | 438/626 |
| 7,022,561 B2* | 4/2006 | Huang et al. | 438/197 |
| 7,115,954 B2* | 10/2006 | Shimizu et al. | 257/369 |
| 7,190,033 B2* | 3/2007 | Chang et al. | 257/371 |
| 7,193,254 B2* | 3/2007 | Chan et al. | 257/274 |
| 7,211,869 B2* | 5/2007 | Chan et al. | 257/369 |
| 7,214,629 B1* | 5/2007 | Luo et al. | 438/778 |
| 7,220,630 B2* | 5/2007 | Cheng et al. | 438/199 |
| 7,244,644 B2* | 7/2007 | Zhu et al. | 438/199 |
| 7,288,451 B2* | 10/2007 | Zhu et al. | 438/228 |
| 7,309,637 B2* | 12/2007 | Lee et al. | 438/303 |
| 7,314,836 B2* | 1/2008 | Golonzka et al. | 438/761 |
| 7,374,987 B2* | 5/2008 | Chidambarrao et al. | 438/197 |
| 2001/0001718 A1* | 5/2001 | Kikushima et al. | 438/238 |
| 2003/0040158 A1* | 2/2003 | Saitoh | 438/279 |
| 2003/0181005 A1* | 9/2003 | Hachimine et al. | 438/231 |
| 2004/0029323 A1 | 2/2004 | Shimizu et al. | |
| 2004/0104405 A1* | 6/2004 | Huang et al. | 257/199 |
| 2004/0180483 A1 | 9/2004 | Park et al. | |
| 2004/0180504 A1 | 9/2004 | Lee et al. | |
| 2005/0020022 A1* | 1/2005 | Grudowski | 438/305 |
| 2005/0069816 A1 | 3/2005 | Jung et al. | |
| 2005/0194596 A1* | 9/2005 | Chan et al. | 257/66 |
| 2005/0214998 A1* | 9/2005 | Chen et al. | 438/199 |
| 2005/0230756 A1* | 10/2005 | Chang et al. | 257/351 |
| 2006/0128086 A1* | 6/2006 | Chidambarrao et al. | 438/199 |
| 2006/0228848 A1* | 10/2006 | Chan et al. | 438/199 |
| 2007/0048907 A1* | 3/2007 | Lee et al. | 438/142 |
| 2007/0077708 A1* | 4/2007 | Frohberg et al. | 438/257 |

FOREIGN PATENT DOCUMENTS

| | | |
|---|---|---|
| JP | 2003-60076 A | 2/2003 |
| JP | 2004-282068 A | 10/2004 |
| KR | 1995-0011781 B1 | 10/1995 |
| KR | 10-0247478 B1 | 3/2000 |
| KR | 2002-0054898 | 7/2002 |
| KR | 10-2004-0057519 A | 7/2004 |
| KR | 10-2004-0079747 A | 9/2004 |
| KR | 10-2004-0080510 A | 9/2004 |
| KR | 10-2004-0102656 A | 12/2004 |

OTHER PUBLICATIONS

JSR Micro Materials Innovation, "Tarc Resists", downloaded on Sep. 17, 2005 from http://www.jsrmicro.com/pro_photo_Tarc.html.

* cited by examiner

METHODS OF FABRICATING INTEGRATED CIRCUIT TRANSISTORS BY SIMULTANEOUSLY REMOVING A PHOTORESIST LAYER AND A CARBON-CONTAINING LAYER ON DIFFERENT ACTIVE AREAS

FIELD OF THE INVENTION

This invention relates to integrated circuit transistor fabrication methods, and more particularly methods of fabricating integrated circuit transistors that employ nitride stress-generating layers

BACKGROUND OF THE INVENTION

Integrated circuits are widely used for consumer, commercial and other applications. As is well known to those having skill in the art, an integrated circuit may include a large number of active devices, such as transistors, on an integrated circuit substrate. As the integration density of integrated circuit devices continues to increase, the number and/or complexity of processing steps may increase, and the performance of the individual devices may decrease. This increase in fabrication complexity may manifest itself in an increase in the number of masks that are used to define various regions in the integrated circuit.

One technique that has been used in attempts to improve the performance of n-channel field effect transistors (also referred to as NFETs) is the addition of stress in the NFET channel using a stress-generating material. The stress-generating material is generally a nitride material such as silicon nitride. When coated on an NFET device, the stress-generating material can induce stress in the NFET channel, which can increase mobility in the NFET channel. The stress may be memorized in the NFET channel by annealing the integrated circuit having the stress-generating layer thereon, so that the stress that is induced in the channel is "memorized" or rendered permanent in the channel. The stress-generating layer may then be removed.

Conventional field effect transistor fabrication processes may employ a first mask for source/drain implantation in an NFET, a second mask for source/drain implantation in a p-channel field effect transistor (PFET), and yet another mask to define a nitride stress-generating layer for the NFET. Unfortunately, the number of masks that are used may impact the cost, fabrication time and/or reliability of the integrated circuit. Moreover, in fabricating these devices, when a photoresist is etched to form one or more of these masks, the etched photoresist may react with the silicon nitride stress-generating layer and may produce contamination in the nitride stress-generating layer. This contamination is also referred to as "resist footing", "nitride contamination" and/or "resist scum".

SUMMARY OF THE INVENTION

Integrated circuit transistors may be fabricated, according to some embodiments of the present invention, by simultaneously removing a photoresist layer on a first active area of an integrated circuit substrate and a carbon-containing layer on a second active area of the integrated circuit substrate, to expose a nitride stress-generating layer on the second active area. The nitride stress-generating layer may then be removed from the second active area. Dopants may then be implanted into the second active area to form source/drain regions in the second active area, while simultaneously blocking implantation of the dopants into the nitride stress-generating layer on the first active area by the carbon-containing layer on the first active area. The carbon-containing layer may then be removed from the nitride stress-generating layer on the first active area and annealing may be performed to memorize stress in the first active area that is generated by the nitride stress-generating layer thereon. The nitride stress-generating layer may be removed from the first active area. In some embodiments, the carbon-containing layer comprises an amorphous carbon layer. In other embodiments, the carbon-containing layer comprises an organic top-coating material for photoresist, such as NFC top coating material, marketed by Japan Synthetic Rubber (JSR).

Integrated circuit transistors may be fabricated, according to other embodiments of the present invention, by forming on an integrated circuit substrate, a first active area including a first insulated gate thereon and a second active area including a second insulated gate thereon. The following layers are then sequentially blanket formed on both the first and second active areas: a nitride stress-generating layer, a carbon-containing layer, an etch stop layer and a photoresist layer. The photoresist layer is then selectively removed from the etch stop layer on the second active area, to expose the etch stop layer on the second active area, while retaining at least some of the photoresist layer on the etch stop layer on the first active area. The etch stop layer that is exposed on the second active area is then removed. The photoresist layer on the first active area is then etched to expose the etch stop layer on the first active area, while simultaneously etching the carbon-containing area on the second active area, to expose the nitride stress-generating layer on the second active area. The etch stop layer that is exposed on the first active area is removed, to expose the carbon-containing layer on the first active area. The nitride stress-generating layer that is exposed on the second area is then removed. Dopants are then implanted into the second active area, to form source/drain regions in the second active area, while simultaneously blocking implantation of the dopants into the nitride stress-generating layer on the first active area by the carbon containing layer on the first active area. The carbon-containing layer is then removed from the nitride stress-generating layer on the first active area. Annealing is performed to memorize stress in the first active area that is generated by the nitride stress-generating layer. The nitride stress-generating layer may then be removed from the first active area.

In some embodiments, prior to sequentially blanket forming the nitride stress-generating layer, the first active area is formed to include the first insulated gate thereon, source/drain regions on opposite sides and spaced apart from the first insulated gate, extension regions between the source/drain regions and the first insulated gate. The second active area is fabricated to include the second insulated gate thereon and first and second extension regions on opposite sides of the second insulated gate. Moreover, in some embodiments, removing the etch stop layer that is exposed on the first active area and removing the nitride stress-generating layer that is exposed on the second active area, are performed simultaneously. In other embodiments, an oxide layer is also formed on the first and second active areas prior to sequentially blanket forming the nitride stress-generating layer. Finally, in some embodiments, the first active area is an NFET active area, and the second active area is a PFET active area.

In still other embodiments of the present invention, the etch stop layer need not be used. Thus, in these embodiments, a nitride stress-generating layer, a carbon-containing layer and a photoresist layer are sequentially blanket formed on both the first and second active areas, and the photoresist layer is selectively removed on the second active area while retaining at least some of the photoresist layer on the first active area. The photoresist layer is then etched on the first active area while simultaneously etching the carbon-containing layer on the second active area. The etch stop layer is then removed on the first active area and the nitride stress-generating layer is removed on the second active area. Dopants are implanted into the second active area while simultaneously blocking implantation into the nitride stress-generating layer on the first active area by the carbon-containing layer on the first active area. The carbon-containing layer may then be removed from the nitride stress-generating layer on the first active area, annealing may be performed to memorize stress, and the nitride stress-generating may then be removed. In any of the above embodiments, the carbon-containing layer may be an amorphous carbon layer and/or an organic top-coating material for photoresist, such as the NFC top-coating material marketed by JSR.

DETAILED DESCRIPTION

Figure 1:
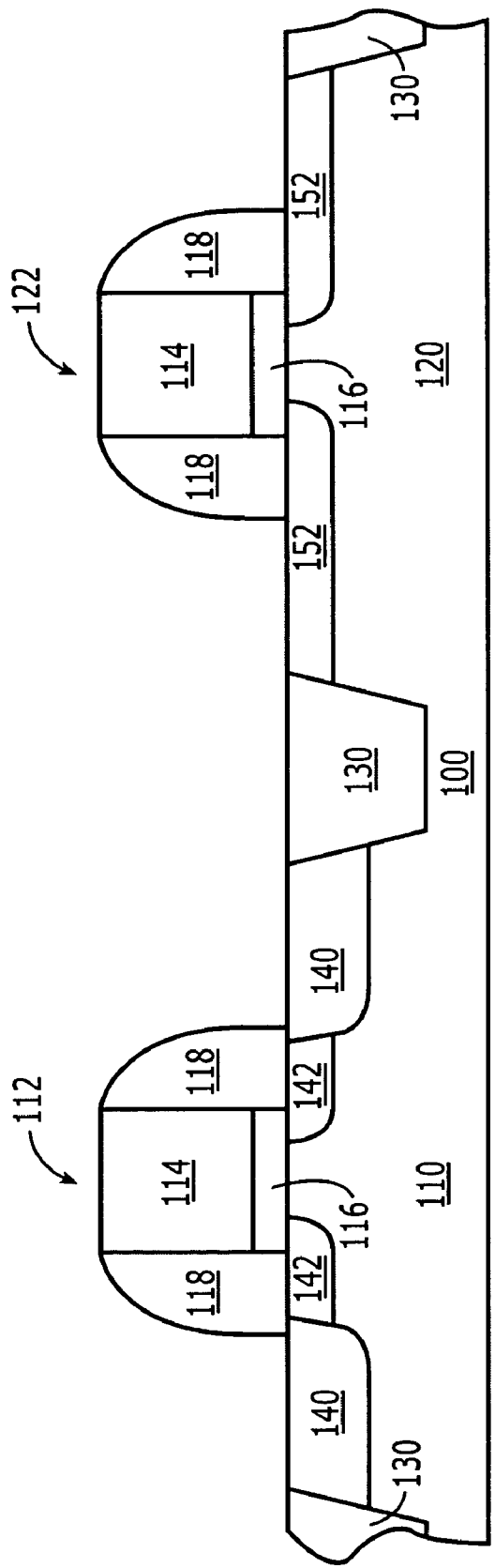
FIGS. 1-8 are side cross-sectional views of methods of fabricating integrated circuit transistors according to various embodiments of the present invention during intermediate fabrication steps according to various embodiments of the present invention.

The invention will be described more fully hereinafter with reference to the accompanying drawings, in which example embodiments of the invention are shown. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. In the drawings, the size and relative sizes of layers and regions may be exaggerated for clarity. Moreover, each embodiment described and illustrated herein includes its complementary conductivity type embodiment as well. Like numbers refer to like elements throughout.

It will be understood that when an element or layer is referred to as being "on", "connected to" and/or "coupled to" another element or layer, it can be directly on, connected or coupled to the other element or layer or intervening elements or layers may be present. In contrast, when an element is referred to as being "directly on," "directly connected to" and/or "directly coupled to" another element or layer, there are no intervening elements or layers present. As used herein, the term "and/or" may include any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms may be used to distinguish one element, component, region, layer and/or section from another region, layer and/or section. For example, a first element, component, region, layer and/or section discussed below could be termed a second element, component, region, layer and/or section without departing from the teachings of the present invention.

Spatially relative terms, such as "beneath", "below", "lower", "above", "upper" and the like, may be used herein for ease of description to describe an element and/or a feature's relationship to another element(s) and/or feature(s) as illustrated in the figures. It will be understood that the spatially relative terms are intended to encompass different orientations of the device in use or operation in addition to the orientation depicted in the figures. For example, if the device in the figures is turned over, elements described as "below" and/or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular terms "a", "an" and "the" are intended to include the plural forms as well, unless the context clearly indicates otherwise. It will be further understood that the terms "comprises," "comprising," "includes" and/or "including" when used in this specification, specify the presence of stated features, integers, steps, operations, elements, and/or components, but do not preclude the presence or addition of one or more other features, integers, steps, operations, elements, components, and/or groups thereof.

Example embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, may be expected. Thus, the disclosed example embodiments of the invention should not be construed as limited to the particular shapes of regions illustrated herein unless expressly so defined herein, but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention, unless expressly so defined herein.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Some embodiments of the present invention may arise from recognition that the same mask may be used to define a nitride stress management layer for NMOS devices, and to define source/drain implantation regions for PMOS devices. The number of masks may thereby be reduced. Moreover, some embodiments may arise from a recognition that nitrogen contamination of a nitride stress-generating layer during photoresist etching may be reduced or eliminated by providing a carbon-containing layer that can be etched simultaneously with etching the photoresist layer, while reducing or preventing nitrogen contamination on an underlying nitride stress-generating layer.

FIGS. 1-8 are side cross-sectional views of methods of fabricating integrated circuit transistors according to various embodiments of the present invention during intermediate fabrication steps according to various embodiments of the present invention. Referring now to FIG. 1, a first active area 110 including a first insulated gate 112 thereon, and second active area 120 including a second insulated gate 122 thereon, are formed on an integrated circuit substrate 100. The integrated circuit substrate may be a single and/or compound semiconductor integrated circuit substrate including one or more layers thereon, and/or may be a semiconductor layer on a substrate. Example integrated circuit substrates 100 can include monocrystalline silicon substrates or semiconductor-on-insulator substrates. The first active region 110 may be used to form an n-channel field effect transistor (NFET) device, also referred to as an NMOS device, and the second active region 120 may be used to form a p-channel field effect transistor (PFET), also referred to as a PMOS device, so that the integrated circuit substrate may be used to form complementary insulated gate field effect transistors, also referred to as CMOS devices. The first and second active regions may be insulated from one another by an insulating region 130, such as a shallow trench isolation region and/or other insulating region well known to those having skill in the art. The first and second insulated gates 112, 122, respectively, may include a gate electrode 114 that may include one or more conductive layers, and an underlying gate insulating layer 116 that may also include one or more insulating layers. The gate electrodes 114 and/or the gate insulating layers 116 may be the same or different for the first and second insulated gates 112 and 122, respectively. A sidewall spacer 118 also may be included on sidewalls of the first and second insulated gates 112 and 122, respectively. The design of the first and second insulated gates 112 and 122, respectively, are well known to those having skill in the art, and need not be described further herein.

Still referring to FIG. 1, source/drain regions 140 and extension regions 142 also may be formed on the first active region 110, wherein the source/drain regions 140 are spaced apart from the first insulated gate 112, and the extension regions 142 are provided between the insulated gate and the source/drain regions 140. In the second active region 120, extension regions 152 are formed, but source/drain regions are not formed. The design and fabrication of source/drain regions and extension regions are well known to those having skill in the art, and need not be described further herein.

Figure 2:
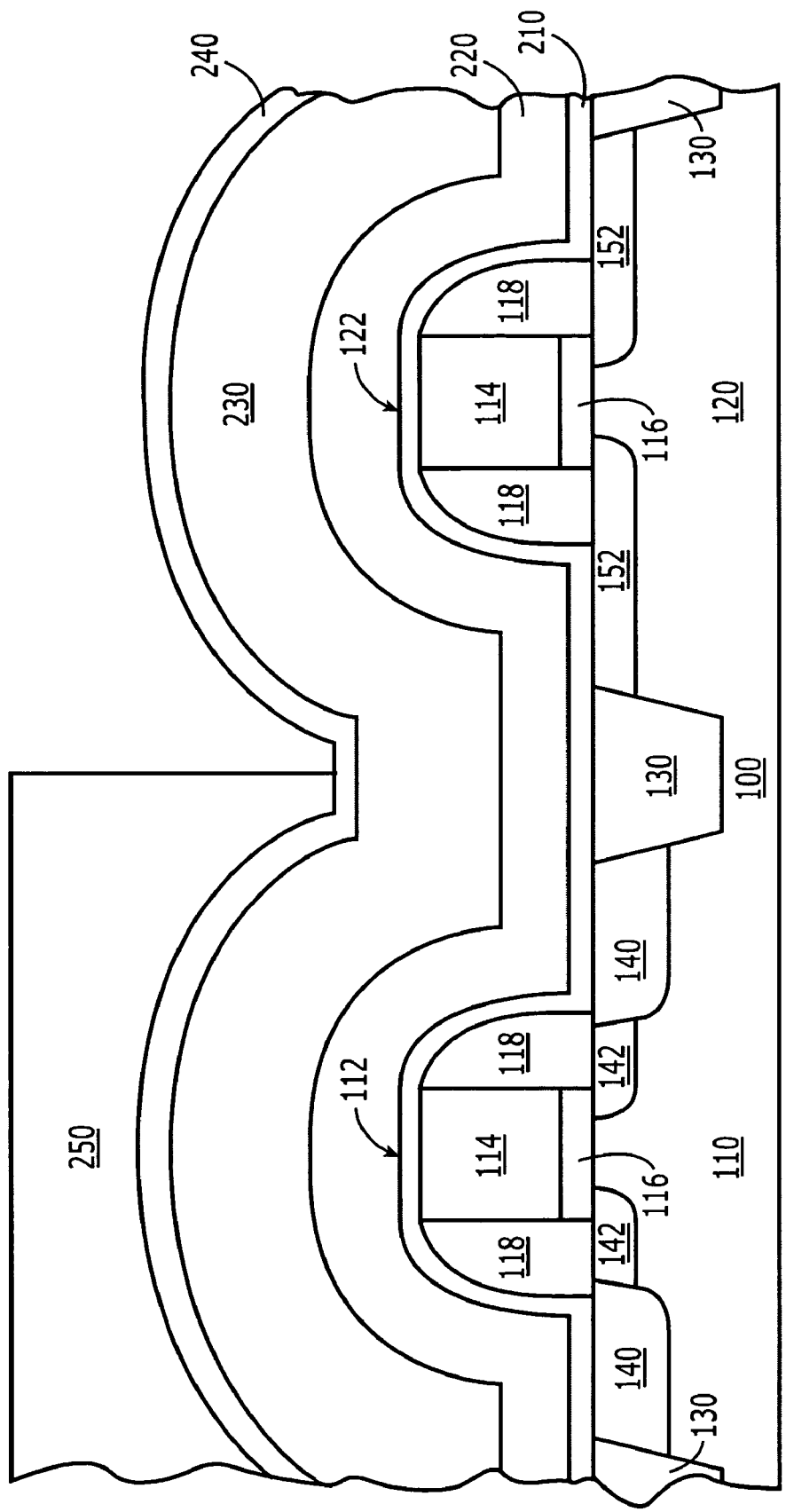

Referring now to FIG. 2, in some embodiments, an oxide layer, such as a silicon dioxide etch stop layer 210, may be formed. The fabrication of an oxide etch stop layer 210 is well known to those having skill in the art, and need not be described further herein.

Continuing with the description of FIG. 2, a nitride stress-generating layer 220, a carbon-containing layer 230, an etch stop layer 240 and a photoresist layer are blanket formed on both the first and second active areas, 110 and 120, respectively. The photoresist layer 250 is selectively removed from the etch stop layer 240 on the second active area 120, to expose the etch stop layer 240 on the second active area 120, while retaining at least some of the photoresist layer 250 on the etch stop layer on the first active area.

The design and fabrication of nitride stress-generating layers 220 are well known to those having skill in the art and need not be described further herein. The carbon-containing layer 230 may be an amorphous carbon layer or an organic top-coating materials for photoresist, such as the NFC top-coating material marketed by Japan Synthetic Rubber (JSR). The design and fabrication of amorphous carbon layers and organic top-coating materials for photoresists are well known to those having skill in the art and need not be described further herein. Finally, the etch stop layer 240 may be a low temperature oxide (LTO) and/or other etch stop layer well known to those having skill in the art. Finally, the fabrication and patterning of the photoresist layer 250 is well known to those having skill in the art and need not be described further herein.

Figure 3:
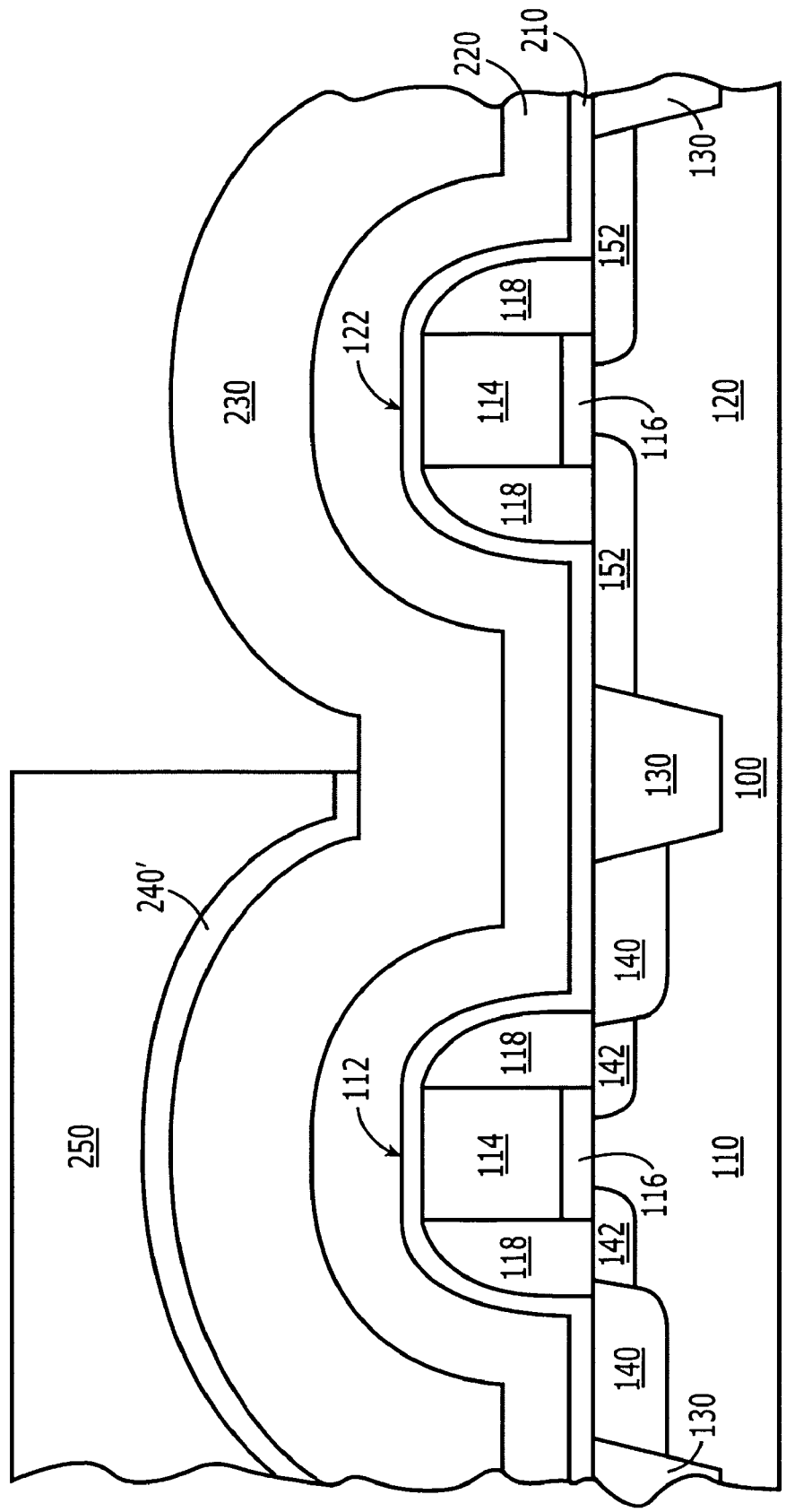
Figure 4:
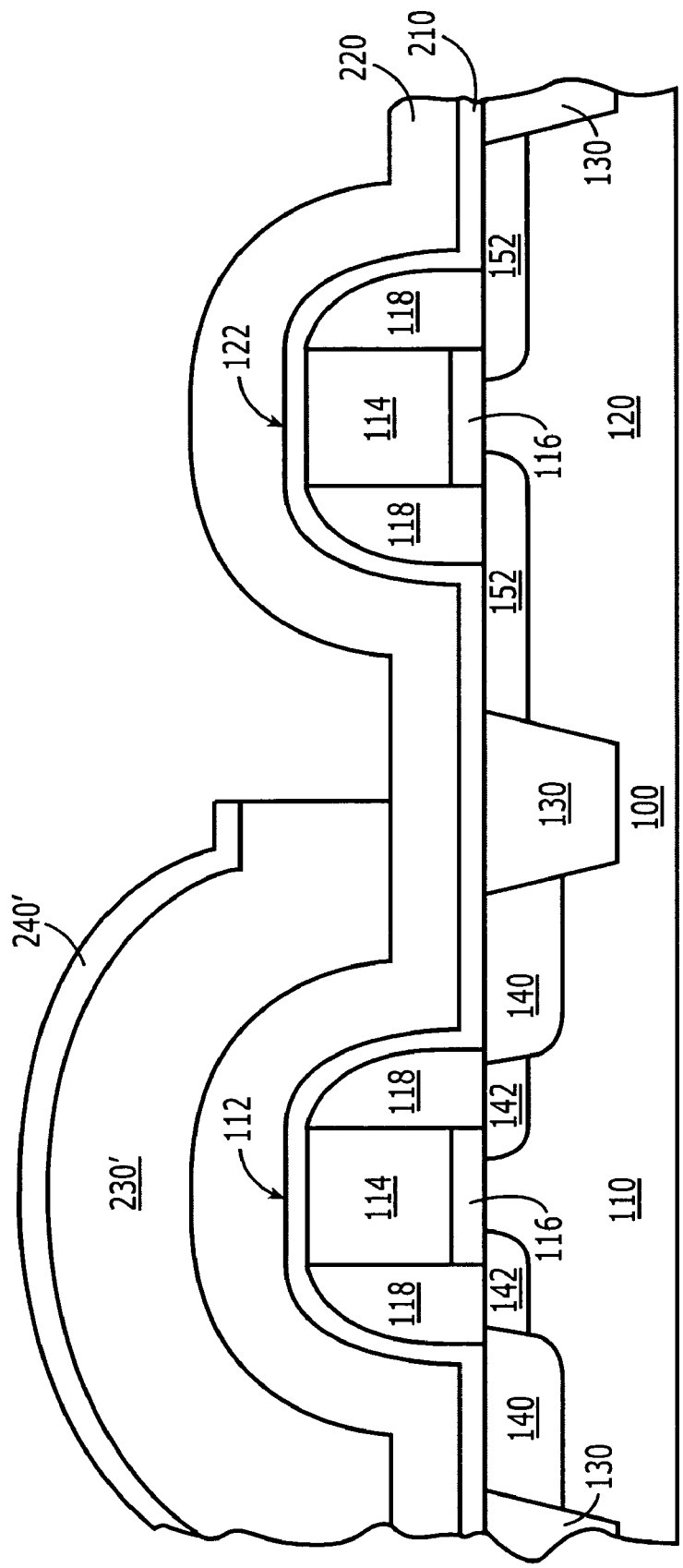

Referring now to FIG. 3, the etch stop layer 240 that is exposed on the second active area 120 is removed, so that the etch stop layer 240' remains on the first active area 110. Then, referring to FIG. 4, the photoresist layer 250 on the first active area 110 is etched, to expose the remaining etch stop layer 240' on the first active area 110, while simultaneously etching the carbon-containing layer 230 on the second active area 120, to expose the nitride stress-generating layer 220 on the second active area 120. In some embodiments, since both the photoresist layer 250 and the carbon-containing layer contain carbon, a 1:1 etch may be formed on both layers using a conventional photoresist etchant, so that, in some embodiments, all of the photoresist layer 250 on the first active area 110 and all of the carbon-containing layer 230 on the second active area 120 may be removed simultaneously. The carbon-containing layer 230' on the first active area 110 remains. Moreover, during the removal of the photoresist layer 250 on the first active area 110, the stress-generating layer 220 on the second active area is covered by the carbon-containing layer 230 on the second active area 120, so that contamination of the nitride stress-generating layer 220 on the second active area 120 during removal of the photoresist layer 250 may be reduced or prevented.

Figure 5:
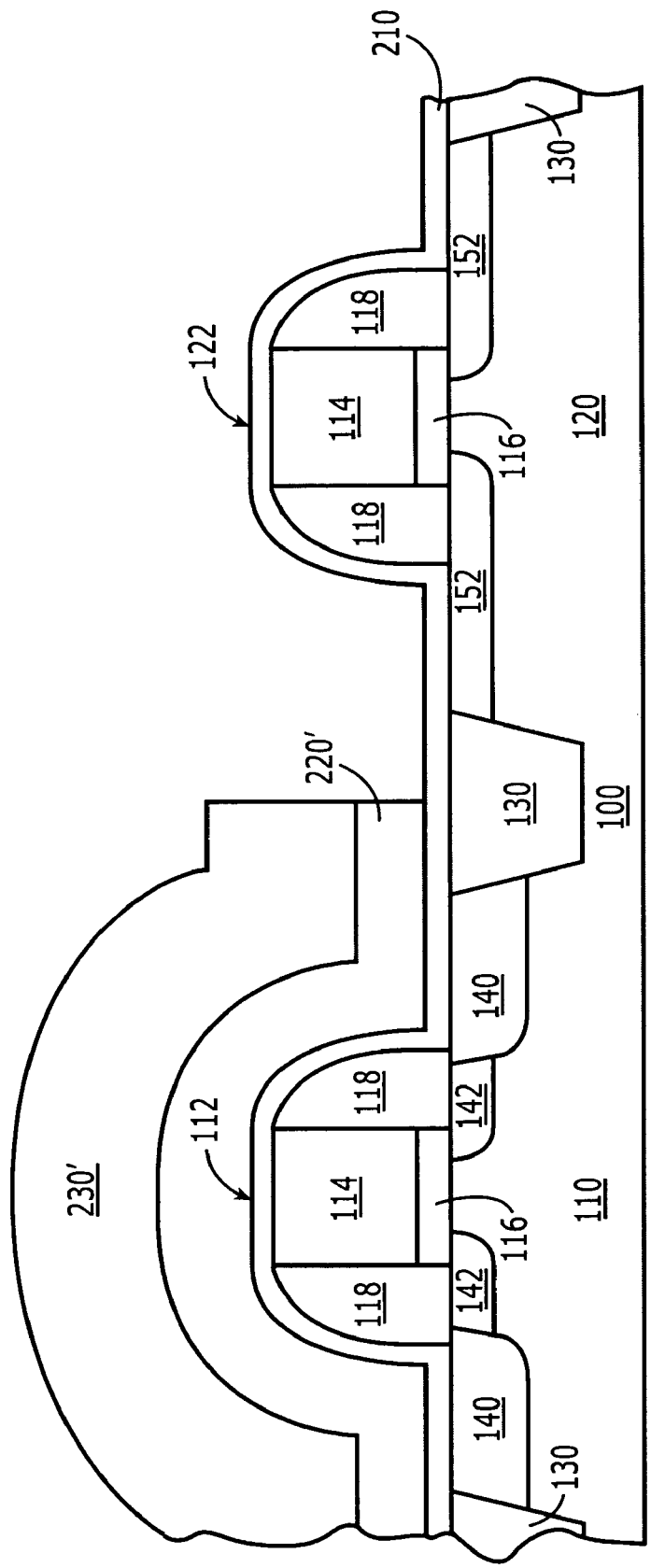

Referring now to FIG. 5, the etch stop layer 240' that is exposed on the first active area 110 is removed, to expose the carbon-containing layer 230' on the first active area. The nitride stress-generating layer 220 that is exposed on the second active area 120 is removed, so that nitride stress-generating layer 220' remains on the first active area 110. In some embodiments, the etching of the etch stop layer 240' on the first active area 110, and the etching of the nitride stress-generating layer 220 on the second active area 120 may be performed simultaneously using a conventional etchant with a 1:5 etch ratio, in some embodiments. Moreover, in other embodiments, the operations of FIGS. 4 and 5 may be performed using one continuous etching operation using conventional etchants.

Figure 6:
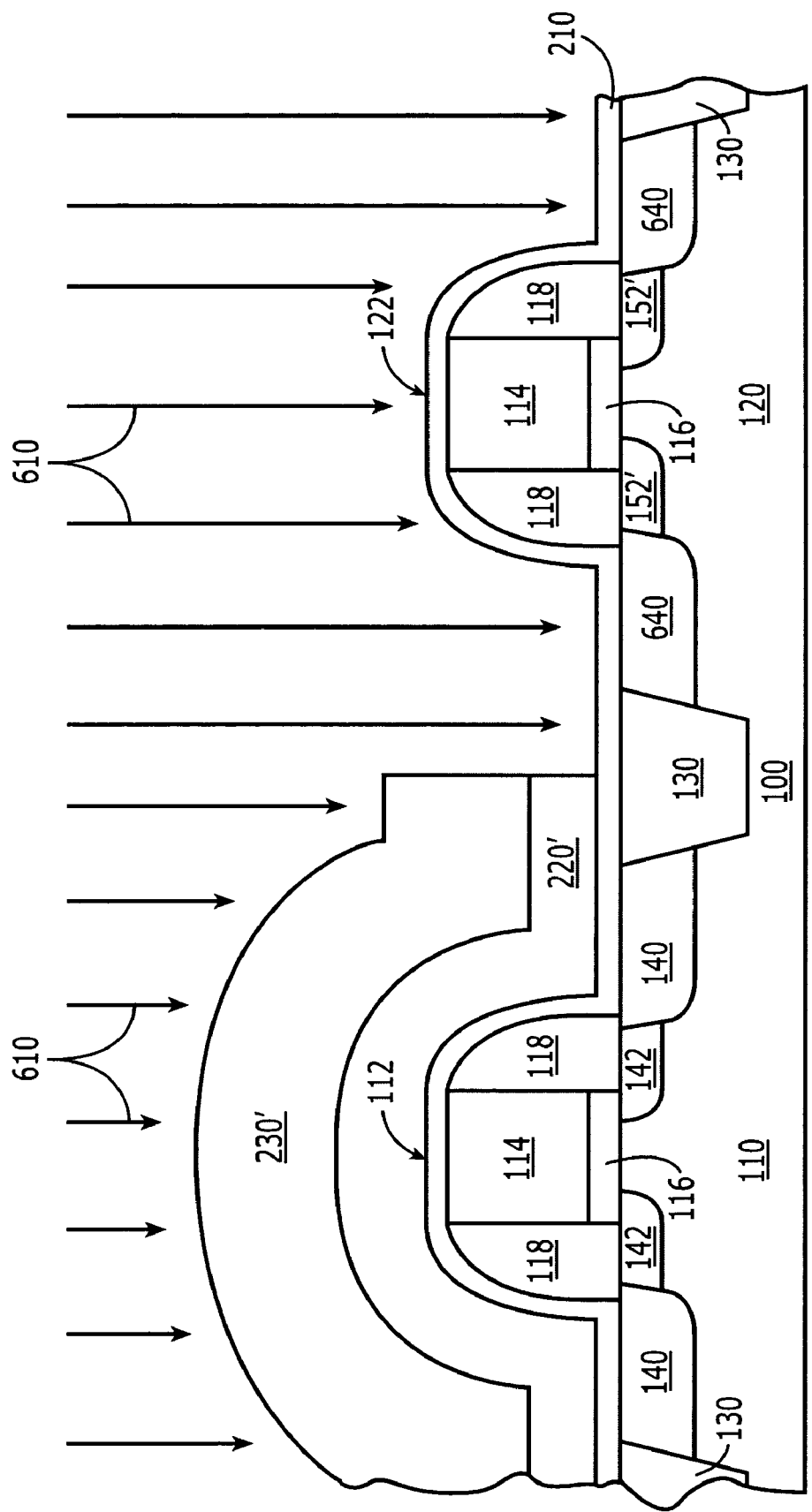

Referring now to FIG. 6, dopants, such as germanium dopants 610, are implanted to the second active area 120, to form source/drain regions 640 in the second active area 120, while simultaneously blocking implantation of the dopants 610 into the nitride stress-generating layer 220' on the first active area 110 by the carbon-containing layer 230' on the first active area. In some embodiments, the dopants 610 may be implanted through the etch stop layer 210. In other embodiments, the etch stop layer 210 may be removed. Accordingly, the carbon-containing layer 230' can reduce or prevent the dopants 610 from being implanted into, and potentially degrading, the nitride stress-generating layer 220'. It will also be understood that the implantation of dopants 610 is illustrated as being orthogonal to the substrate 100. However, combinations of orthogonal and/or oblique implantations also may be performed using techniques well known to those having skill in the art.

Figure 7:
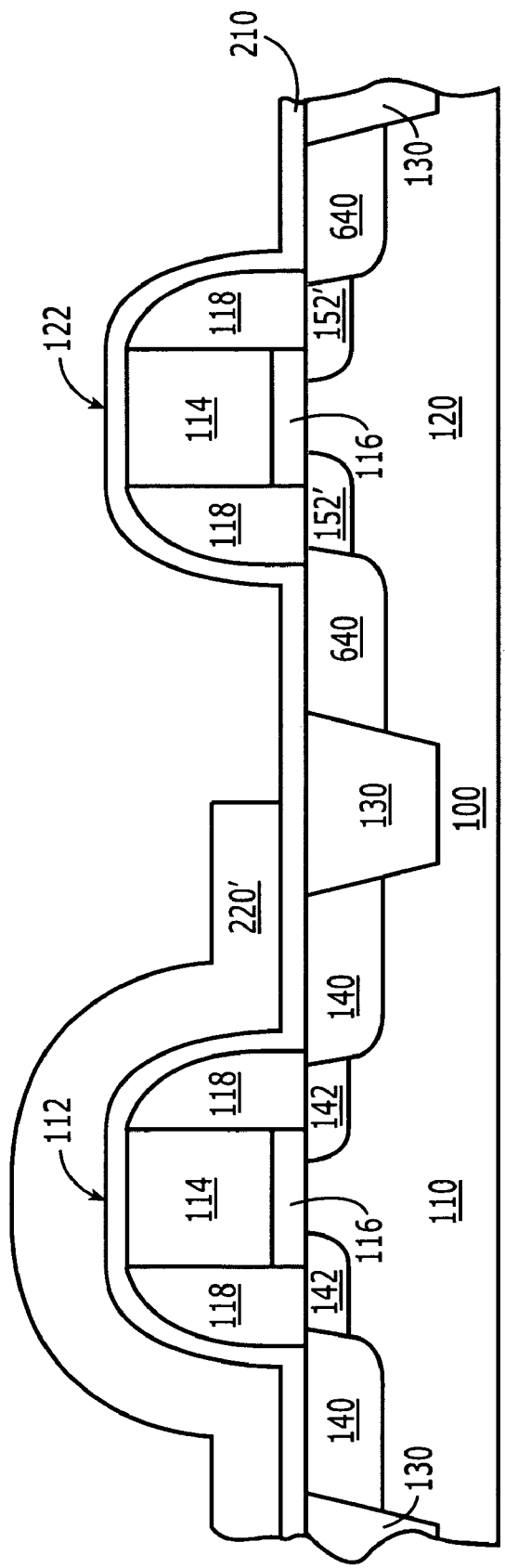
Figure 8:
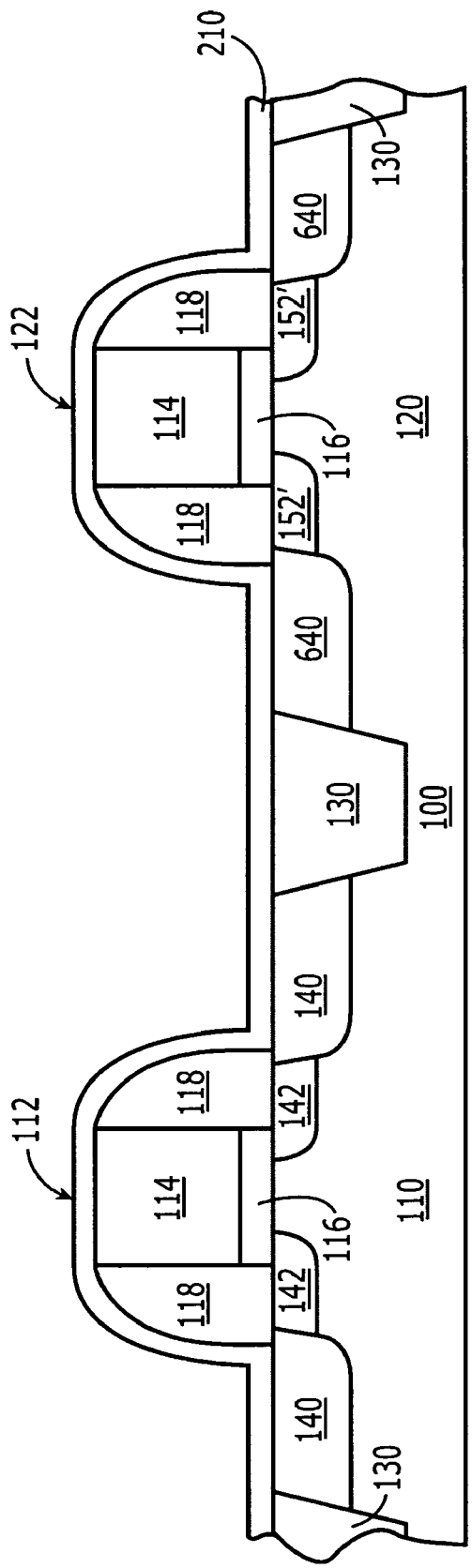

Referring now to FIG. 7, the remaining carbon-containing layer 230' on the first active area 110 is removed, and annealing is performed to memorize the stress in the first active area 110 that is generated by the nitride stress-generating layer 220' on the first active area 110. Referring now to FIG. 8, after the stress has been memorized, the nitride stress-generating layer 220' is removed from the first active area 110, for example using a wet etch. Subsequent conventional processing steps may be performed, for example, to form silicide contacts and to perform additional conventional processing steps well known to those having skill in the art, to complete the transistors.

In other embodiments of the present invention, the etch stop layer 240 of FIG. 2 need not be used and the photoresist 250 on the active area 110 and the carbon-containing layer 230 on the second active area 120 may be etched simultaneously without the need for etch stop layer 240.

Accordingly, embodiments of the invention that have been described above can simultaneously remove a photoresist layer 250 on a first active area 110 of an integrated circuit substrate 100, and a carbon-containing layer 230 on a second active area 120 of the integrated circuit substrate 100, to expose a nitride stress-generating layer 220 on the second active area 120, while reducing or eliminating contamination of the nitride stress-generating layer 220 on the second active area 120. Moreover, a single mask 250 may be used to define the second active area 120 for removal of a nitride stress-generating layer 220 and for source/drain implants 640 in the second active area 120, for example for a PFET. Accordingly, reduced process complexity and/or reduced contamination may be obtained.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A method of fabricating integrated circuit transistors comprising:
    forming on an integrated circuit substrate, a first active area including a first insulated gate thereon and a second active area including a second insulated gate thereon;
    sequentially blanket forming on both the first and second active areas, a nitride stress-generating layer, a carbon-containing layer, an etch stop layer and a photoresist layer;
    selectively removing the photoresist layer from the etch stop layer on the second active area to expose the etch stop layer on the second active area while retaining at least some of the photoresist layer on the etch stop layer on the first active area;
    removing the etch stop layer that is exposed on the second active area;
    etching the photoresist layer on the first active area to expose the etch stop layer on the first active area while simultaneously etching the carbon-containing layer on the second active area to expose the nitride stress-generating layer on the second active area;
    removing the etch stop layer that is exposed on the first active area to expose the carbon-containing layer on the first active area;
    removing the nitride stress-generating layer that is exposed on the second active area;
    implanting dopants into the second active area to form source/drain regions in the second active area while simultaneously blocking implantation of the dopants into the nitride stress-generating layer on the first active area by the carbon-containing layer on the first active area;
    removing the carbon-containing layer from the nitride stress-generating layer on the first active area;
    annealing to memorize stress in the first active area that is generated by the nitride stress-generating layer thereon; and
    removing the nitride stress-generating layer from the first active area.

2. A method according to claim 1 wherein the carbon-containing layer comprises an amorphous carbon layer.

3. A method according to claim 1 wherein the carbon-containing layer comprises an organic top-coating material for photoresist.

4. A method according to claim 1 wherein forming on an integrated circuit substrate, a first active area including a first insulated gate thereon and a second active area including a second insulated gate thereon comprises forming on the integrated circuit substrate, the first active area including a first insulated gate thereon, source/drain regions on opposite sides and spaced apart from the first insulated gate and extension regions between the source/drain regions and the first insulated gate, and a second active area including a second insulated gate thereon and first and second extension regions on opposite sides of the second insulated gate.

5. A method according to claim 1 wherein removing the etch stop layer that is exposed on the first active area to expose the carbon-containing layer on the first active area and removing the nitride stress-generating layer that is exposed on the second active area are performed simultaneously.

6. A method according to claim 1 wherein the first active area is an NFET active area and the second active area is a PFET active area.

7. A method according to claim 1 wherein sequentially blanket forming is preceded by forming an oxide layer on the first and second active areas.

8. A method according to claim 3 wherein the organic top-coating material for photoresist comprises NFC top-coating material marketed by Japan Synthetic Rubber (JSR).

9. A method of fabricating integrated circuit transistors comprising:
    forming on an integrated circuit substrate, a first active area including a first insulated gate thereon and a second active area including a second insulated gate thereon;
    sequentially blanket forming on both the first and second active areas, a nitride stress-generating layer, a carbon-containing layer and a photoresist layer;
    selectively removing the photoresist layer on the second active area while retaining at least some of the photoresist layer on the first active area;
    etching the photoresist layer on the first active area while simultaneously etching the carbon-containing layer on the second active area;
    removing the nitride stress-generating layer on the second active area;
    implanting dopants into the second active area to form source/drain regions in the second active area while simultaneously blocking implantation of the dopants into the nitride stress-generating layer on the first active area by the carbon-containing layer on the first active area;
    removing the carbon-containing layer from the nitride stress-generating layer on the first active area;
    annealing to memorize stress in the first active area that is generated by the nitride stress-generating layer thereon; and
    removing the nitride stress-generating layer from the first active area.

10. A method according to claim 9 wherein the carbon-containing layer comprises an amorphous carbon layer.

11. A method according to claim 9 wherein the carbon-containing layer comprises an organic top-coating material for photoresist.

12. A method according to claim 9 wherein forming on an integrated circuit substrate, a first active area including a first insulated gate thereon and a second active area including a second insulated gate thereon comprises forming on the integrated circuit substrate, a first active area including first insulated gate thereon, source/drain regions on opposite sides and spaced apart from the first insulated gate and extension regions between the source/drain regions and the first insulated gate, and a second active area including a second insulated gate thereon and first and extension regions on opposite sides of the second insulated gate.

13. A method according to claim 9 wherein the first active area is an NFET active area and the second active area is a PFET active area.

14. A method according to claim 11 wherein the organic top-coating material for photoresist comprises NFC top-coating material marketed by Japan Synthetic Rubber (JSR).

15. A method of fabricating integrated circuit transistors comprising:

simultaneously removing a photoresist layer on a first active area of an integrated circuit substrate and a carbon-containing layer on a second active area of the integrated circuit substrate to expose a nitride stress-generating layer on the second active area;

removing the nitride stress-generating layer on the second active area;

implanting dopants into the second active area to form source/drain regions in the second active area while simultaneously blocking implantation of the dopants into the nitride stress-generating layer on the first active area by the carbon-containing layer on the first active area;

removing the carbon-containing layer from the nitride stress-generating layer on the first active area;

annealing to memorize stress in the first active area that is generated by the nitride stress-generating layer thereon; and removing the nitride stress-generating layer from the first active area.

16. A method of fabricating integrated circuit transistors comprising:

simultaneously removing a photoresist layer on a first active area of an integrated circuit substrate and a carbon-containing layer on a second active area of the integrated circuit substrate to expose a nitride stress-generating layer on the second active area;

wherein the carbon-containing layer comprises an organic top-coating material for photoresist; and wherein the organic top-coating material for photoresist comprises NFC top-coating material marketed by Japan Synthetic Rubber (JSR).

* * * * *